United States Patent
Karpman (10) Patent No.: US 10,315,914 B2
(45) Date of Patent: Jun. 11, 2019

(54) RECONSTRUCTED WAFER BASED DEVICES WITH EMBEDDED ENVIRONMENTAL SENSORS AND PROCESS FOR MAKING SAME

(71) Applicant: The Charles Stark Draper Laboratory, Inc., Cambridge, MA (US)

(72) Inventor: Maurice S. Karpman, Brookline, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 15/633,887

(22) Filed: Jun. 27, 2017

(65) Prior Publication Data

US 2017/0369307 A1 Dec. 28, 2017

Related U.S. Application Data

(60) Provisional application No. 62/354,896, filed on Jun. 27, 2016.

(51) Int. Cl.
*B81B 7/02* (2006.01)
*B81B 7/00* (2006.01)
(Continued)

(52) U.S. Cl.
CPC .......... *B81B 7/0061* (2013.01); *B81C 1/0023* (2013.01); *B81C 1/00309* (2013.01);
(Continued)

(58) Field of Classification Search
CPC .......... B81B 7/0061; B81B 2201/0264; B81C 1/00309; H01L 23/3185; H01L 23/485; H01L 29/84
See application file for complete search history.

(56) References Cited

U.S. PATENT DOCUMENTS 7,981,698 B2 7/2011 Pryputniewicz et al.
8,501,517 B1 * 8/2013 Yow ...................... G01L 19/147
257/E21.504

(Continued)

OTHER PUBLICATIONS

Hsu, C.H. et al., "Micromachined Structures Fabricated Using a Wafer-Bonded Sealed Cavity Process," Technical Digest, Solid-State Sensor and Actuator Workshop, pp. 151-155, 1994. Five pages.

(Continued)

*Primary Examiner* — Allan R Wilson
(74) *Attorney, Agent, or Firm* — HoustonHogle LLP (57) ABSTRACT

A one or multi-die module comprises multiple dies. The module includes at least one die with a sensor having a sensing region, an encapsulation layer covering top sides of the multiple dies, and a redistribution layer (RDL) covering bottom sides of the multiple dies except for the sensing region. In embodiments, a cap is formed over the sensing region, which has at least a portion that is spaced away from a bottom side of the module. Metal connectors, such as solder balls, are formed on the redistribution layer to provide connection points to the module. This approach can be used to incorporate environmental sensor dies into multi-die modules. It utilizes RDL and openings in the RDL in order to provide robust packaging for the dies, while also allowing the sensor dies to be selectively exposed to the environment.

15 Claims, 12 Drawing Sheets

(51) Int. Cl.
*B81C 1/00* (2006.01)
*H01L 23/31* (2006.01)
*H01L 23/485* (2006.01)
*H01L 29/84* (2006.01)
*H01L 23/00* (2006.01)
*G01L 19/14* (2006.01)
*G01L 19/00* (2006.01)

(52) U.S. Cl.
CPC ........ *G01L 19/0069* (2013.01); *G01L 19/147* (2013.01); *H01L 23/3185* (2013.01); *H01L 23/485* (2013.01); *H01L 24/19* (2013.01); *H01L 24/20* (2013.01); *H01L 29/84* (2013.01); *B81B 2201/0264* (2013.01); *B81B 2207/098* (2013.01); *H01L 2924/15151* (2013.01); *H01L 2924/15311* (2013.01); *H01L 2924/181* (2013.01)

(56) References Cited

U.S. PATENT DOCUMENTS

| | | | |
|---|---|---|---|
| 9,176,089 B2 | 11/2015 | Le Neel et al. | |
| 9,611,137 B2 | 4/2017 | Smeys et al. | |
| 2005/0146000 A1* | 7/2005 | Kim | B29C 45/0053 257/670 |
| 2009/0230487 A1* | 9/2009 | Saitoh | B81B 7/0061 257/419 |
| 2009/0278219 A1* | 11/2009 | Morrison | H01L 27/14618 257/432 |
| 2010/0207217 A1* | 8/2010 | Zuniga-Ortiz | B81C 1/0023 257/415 |
| 2010/0207257 A1* | 8/2010 | Lee | B81B 7/0061 257/660 |
| 2011/0248364 A1* | 10/2011 | Huang | B81B 7/0061 257/416 |
| 2012/0001274 A1* | 1/2012 | Chang | B81C 1/00301 257/415 |
| 2013/0292852 A1* | 11/2013 | Fuergut | B81B 7/02 257/777 |
| 2013/0341499 A1* | 12/2013 | Andreason | G01D 5/34715 250/231.1 |
| 2015/0001651 A1* | 1/2015 | Faralli | B81B 3/0021 257/417 |
| 2015/0060956 A1* | 3/2015 | Chen | B81C 1/00246 257/254 |
| 2017/0081175 A1* | 3/2017 | Steiert | B81B 7/007 |
| 2017/0306383 A1* | 10/2017 | Imai | A01N 1/02 |

OTHER PUBLICATIONS

Parameswaran, L. et al., "A Merged MEMS-CMOS Process Using Silicon Wafer Bonding," Proceedings of the International Electron Devices Meeting, pp. 613-616, 1995, IEEE. Four pages.

POSiFA Microsystems, Inc.: PTCD10 Data Sheet: Thermal Conductivity Gas Sensor Die, Jan. 2012: posifamicrosystems.com. Three pages.

Sensirion Data Sheet SHTW2: WLCSP Humidity and Temperature Sensor IC, May 2016: www.sensirion.com. Fourteen pages.

TDK Data Sheet: Barometric Pressure Sensor Die C33, Aug. 2015: www.epcos.com. Nine pages.

\* cited by examiner

RECONSTRUCTED WAFER BASED DEVICES WITH EMBEDDED ENVIRONMENTAL SENSORS AND PROCESS FOR MAKING SAME

RELATED APPLICATIONS

This application claims the benefit under 35 USC 119(e) of U.S. Provisional Application No. 62/354,896, filed on Jun. 27, 2016, which is incorporated herein by reference in its entirety.

BACKGROUND OF THE INVENTION

There are a large number of applications that require the integration of environmental sensors with data processing capabilities. For example, for some applications the external pressure should be detected and then the pressure information transmitted to another device. In fact, as the Internet of Things (IoT) becomes more pervasive, many of the networked smart devices will be, and already are, sensors that capture and measure their surrounding environmental properties and then report that information to a server on a cloud system, for example.

A fundamental contradiction arises, however, when integrating environmental sensors with other data processing capabilities. Semiconductor dies are often packaged to protect the dies from the environment and to prevent damage. On the other hand, sensors must typically be directly exposed to the environment to detect pressure or sense/analyze gases or other fluids, for example.

Nevertheless, a number of techniques have been developed that allow for the integration of environmental sensors with other integrated circuits and systems. U.S. Pat. No. 9,176,089 B2, to Le Neel et al., "Integrated Multi Sensor Module", 2015, describes a multiple environmental sensor module. Also, U.S. Pat. No. 7,981,698 B2, to Pryputniewicz et al., "Removing Integrated Circuits from Packaging", 2011, involves removing the plastic packaging and removing the encapsulating dielectric.

At the same time, the use of redistribution layers (RDL) is somewhat common when flip chip mounting and solder bumps are used. RDL is primarily used when it is required to move the location of bond pads for a given integrated circuit die. Sometimes, when the integrated circuit is designed, the location of the bond pads is fixed. Then later, when that die must be mounted in a package, the bond pads should be moved to a different location. This can happen for a number of reasons. It can be important to spread the contact points around the die so that the stress from the solder balls can be appropriately distributed. RDL is also used in die stacking. In this application similar dies are mounted in a common package. Each die must be wired differently, however, because of possibly addressing requirements. In this case, different address lines can be connected differently for each of the respective dies in the common package. Additionally, RDL can also be used to move the bond pads to more convenient locations. It can even be used to provide compatibility between different dies when the location of the original bond pads makes them incompatible In the typical RDL process, a dielectric layer such as polyamide is deposited over the integrated circuit die. This layer is then patterned to open access to the die's typically aluminum or copper bond pads. This polyimide layer may be several micrometers thick. Conductive metal layers are then deposited between the original bond pad locations and the desired locations for the bond pads/solder balls. Then, a second polyamide layer is deposited over the metal layer, covering the old bond pad and providing an opening at the new bond pad location. The solder ball or bump or the wire bond can then be attached to the new bond pad location.

SUMMARY OF THE INVENTION

The present invention concerns the incorporation of environmental sensor dies into integrated circuit, including multi die, modules. It utilizes RDL and openings in the RDL in order to provide robust packaging for the dies, while also allowing the sensor dies to be selectively exposed to the environment.

In general, according to one aspect, the invention features a single or multi-die module, comprising one or multiple dies, including at least one die with a sensor having a sensing region, an encapsulation layer covering top sides of the one or more dies, and a redistribution layer covering bottom sides of the one or more dies except for the sensing region.

In embodiments, a cap is formed over the sensing region, which has at least a portion that is spaced away from a bottom side of the module. Metal connectors, such as solder balls; are formed on the redistribution layer to provide connection points to the module. A height of the cap from the bottom side of the module should be less than a height of the metal connectors.

In some examples, a channel is formed in the redistribution layer between the sensing region and an outer side of the module. The cap can extend over the sensing region and the channel.

In general, according to another aspect, the invention features an integrated circuit module manufacturing method. This method comprises encapsulating one or multiple dies, including at least one die with a sensor having a sensing region and covering bottom sides of the one or more dies with a redistribution layer covering except for the sensing region.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: "includes", "comprises", "including" and/or "comprising", when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Figure 1:
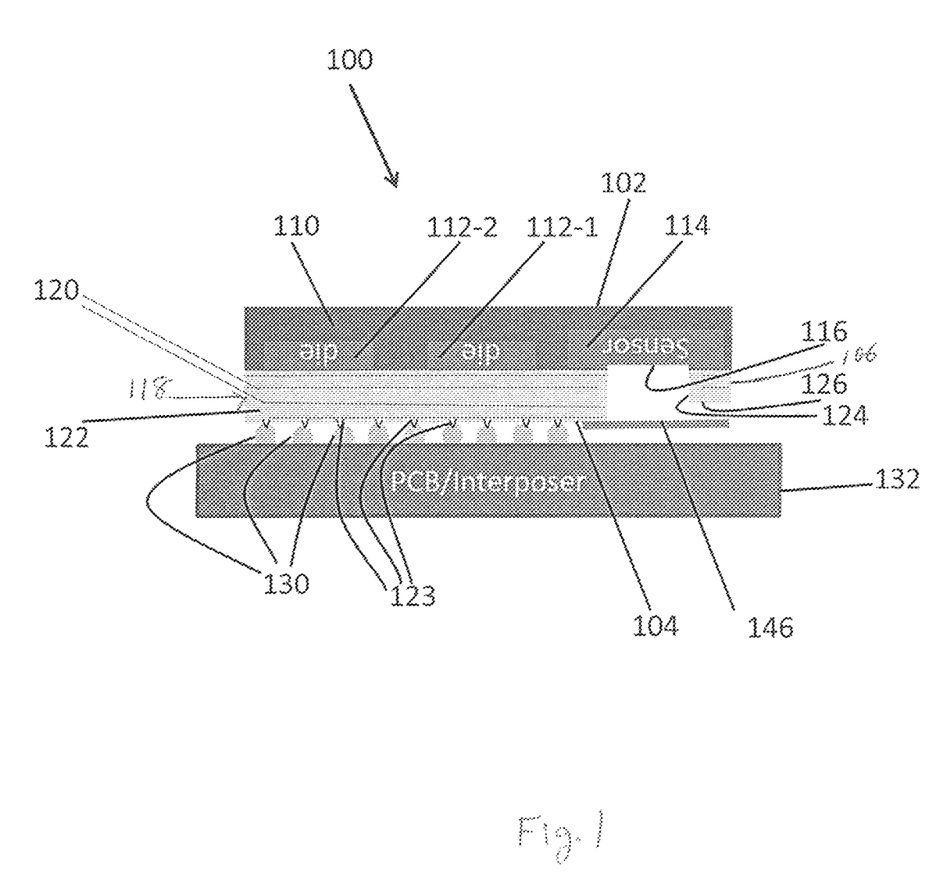
FIG. 1 is a schematic side cross-sectional view of an integrated Ultra High Density (iUHD) multi-die module with robust packaging and sensing surface exposed to ambient atmosphere, constructed according to the present invention.

FIG. 1 shows an integrated Ultra High Density (iUHD) multi-die module 100, which has been constructed according to the principles of the present invention.

In more detail, it shows a sensor die 114. In addition, other dies 112-1, 112-2 are also preferably encapsulated by an encapsulation layer 110. Generally, the encapsulation layer covers the top side 102 of the module 100. Also, preferably, it fills in between the respective dies 112, 114. In the typical embodiment, the encapsulation layer is resin epoxy. It often includes alumina or silica particles.

The bottom side 104 of the module is covered by a redistribution layer (RDL) 118, which comprises dielectric layers 122 and metal RDL interconnect layers 120. Generally, the RDL 118 provides electrical interconnection between the dies 112, 114 and the printed circuit board (PCB) or interposer 132, on which the module 100 is mounted.

In the illustrated example, metal connectors 130, such as solder balls, connect contact areas 123 of exposed portions of the metal layers 120 of the RDL 118. Thus, the metal connectors 130 serve to connect the metal layers 120 of RDL interconnect layer to the electrical connections of the PCB/interposer 132.

In the typical embodiment, the sensor die 114 contains a sensor that measures some environmental characteristic. In one example, the sensor die 114 contains a barometric pressure sensor for sensing ambient atmospheric pressure. In another example, the sensor die contains a humidity and temperature sensor for sensing an ambient humidity and temperature. In still other examples, the sensor die includes a gas sensor, such as a thermal conductivity gas sensor, for detecting gases in the ambient atmosphere. Such sensors can be used to detect natural gas (typically, methane or $CH_4$), hydrogen ($H_2$), refrigerant gases, carbon dioxide ($CO_2$). In still other examples, the sensor die contains more than one of these sensors.

Since the sensor die 114 senses an environmental characteristic, it must be exposed to the environment. As a result, in the illustrated example the sensing region 116 of the sensor die, is exposed and not covered by the RDL 118. Instead, there is a sensing region port 124 that extends through the RDL to expose the sensing region 116 of the sensor die 114. Further, in the illustrated example, there is a sensor channel 126 that connects the sensing region port 124 and extends laterally to an edge 106 of the module 100.

Figure 2:
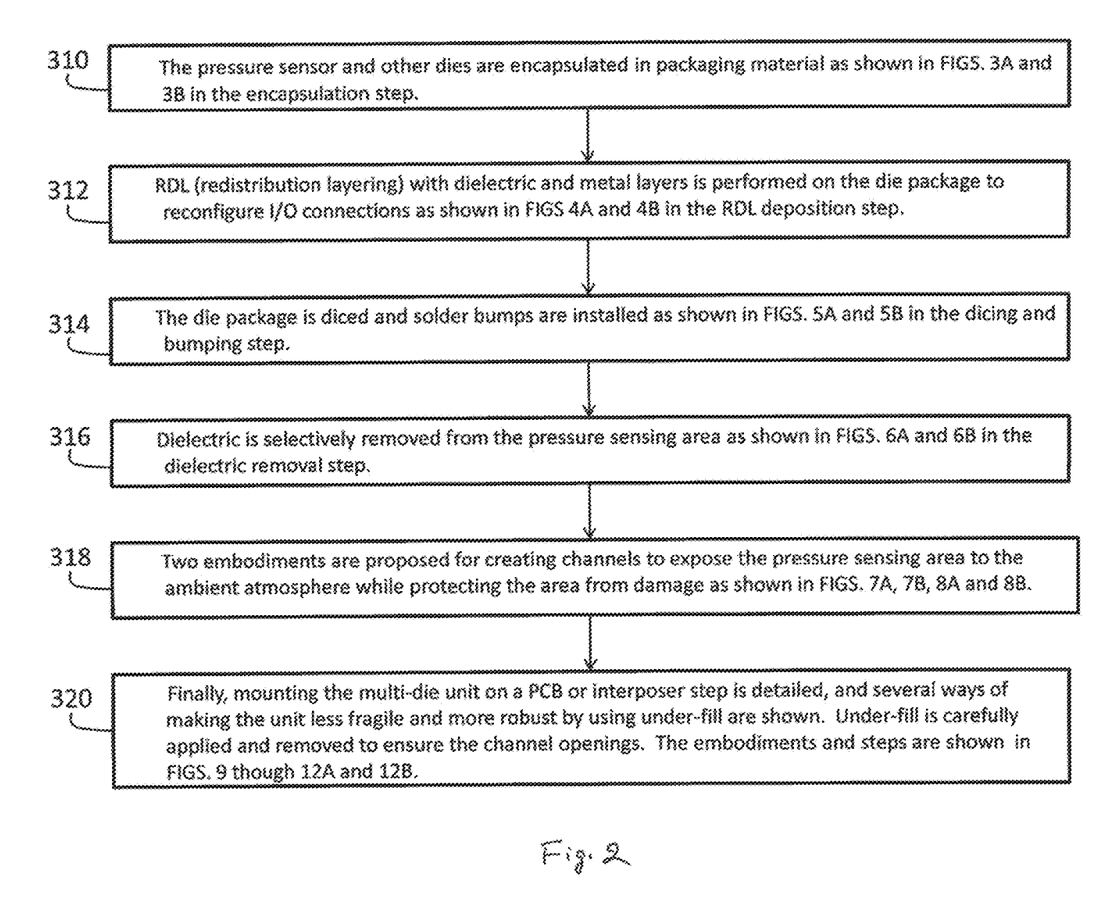
FIG. 2 is a flow diagram describing the steps and processes undertaken to fabricate the multi-die module according to the principles of this invention.

FIG. 2 is a flow diagram illustrating a fabrication process for the multi-die module 100 shown in FIG. 1. Reference will now be made to the method steps shown in FIG. 2 and FIGS. 3 through 12, which show the module 100 in the various fabrication steps.

In the first step 310, the sensor die 114 along with the other dies 112 are encapsulated in the packing teaching material. The sensor die 114 is typically located toward an edge of the multi-die module 100 in order to provide an easy path to exposing it to the ambient environment.

Figure 3A:
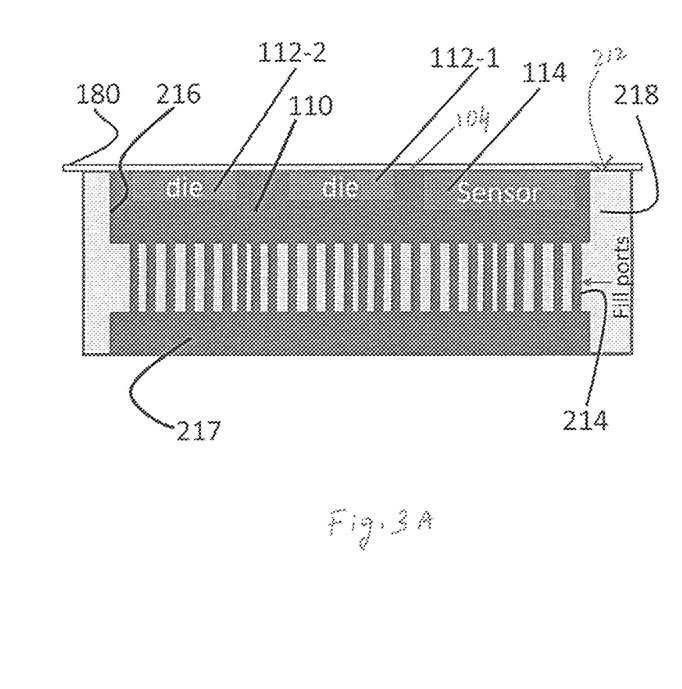
FIG. 3A is a schematic side cross-sectional view of the dies, with pressure sensor on right, in the encapsulation step in a cavity wafer, showing fill ports.
Figure 3B:
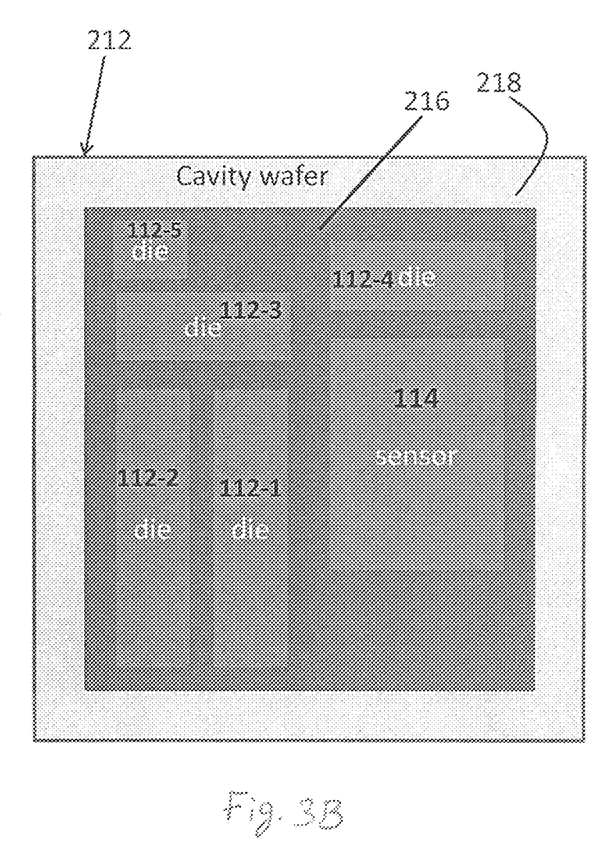
FIG. 3B is a schematic bottom view of the dies in the well of the cavity in a cavity wafer.

FIGS. 3A and 3B illustrate the encapsulation step. Specifically, the dies 112-1 to 112-5 are laid out in a cavity 216 of a cavity wafer 212. Specifically, the dies are laid out in their desired locations within the well area formed in the cavity wafer's cavity 216. Preferably, the bottom sides of the dies 114, 112 are covered by thermal release tape 180.

As is more clearly shown in FIG. 3A, fill ports 214 extend between an encapsulation reservoir 217 and the cavity 216 of the cavity wafer 212. The encapsulation reservoir 217 contains the liquid packaging material, such as an epoxy resin. It is injected through the fill ports 214 into the cavity 216 and in this way encapsulates the dies 212, 214 that are laid out in the cavity 216 of the cavity wafer 212. The sidewalls 218 of the cavity wafer 212 laterally contain the packaging material to form the encapsulation layer 110 surrounding the dies 212, 214. In this orientation, the bottom side 104 of the partially fabricated multi-die module 100 leaves the dies 112, 114 uncovered as is also shown in FIG. 3B.

Returning to FIG. 2, in the next step 312 (see FIGS. 4A and 4B), the RDL 118 materials, including the metal interconnect layers 120 and the dielectric layers 122, are deposited on the bottom sides 104 of the dies 112, 114 held in the encapsulation layer 110. Prior to this step, the thermal release tape is removed.

Figure 4A:
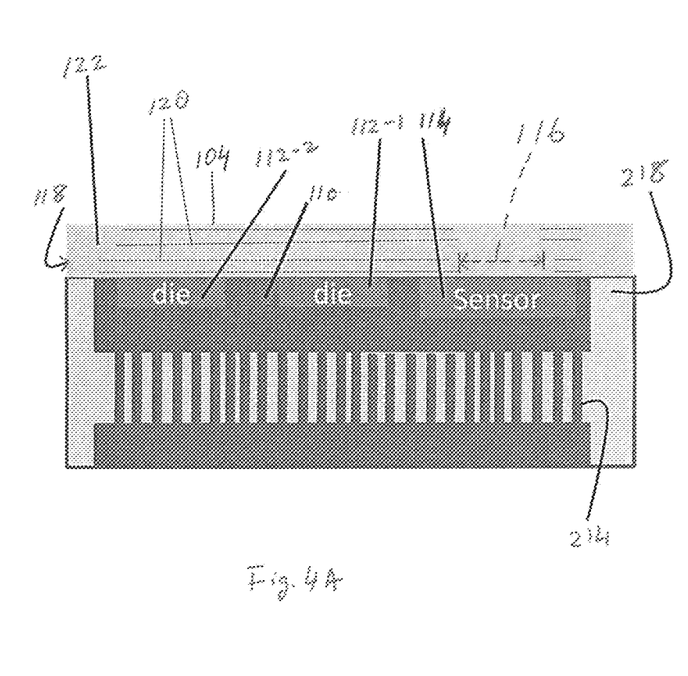
FIG. 4A is a schematic side cross-sectional view of the dies in the RDL (redistributed layer) step.
Figure 4B:
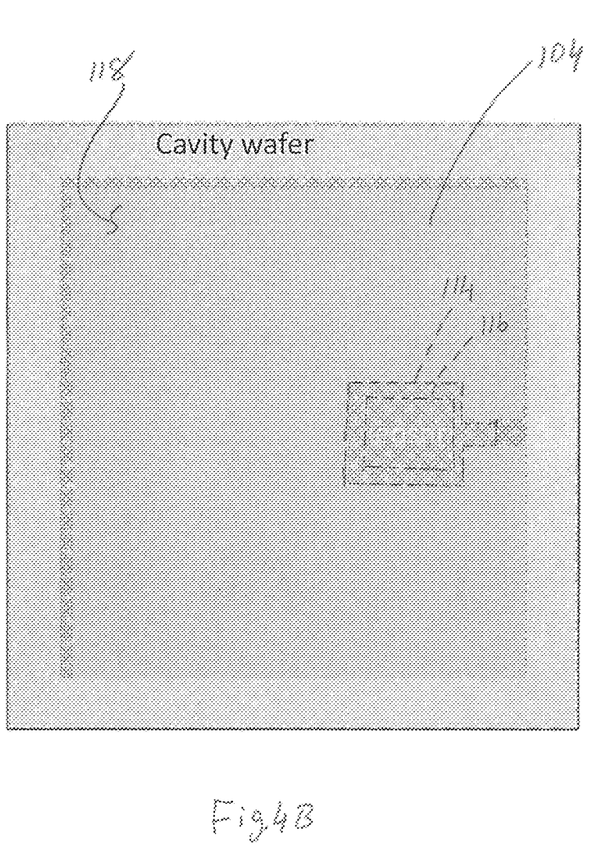
FIG. 4B is a schematic bottom view of the dies in the RDL step.

Generally, the dielectric layers 122 cover and protect the bottom sides of the dies 112, 114. The metal interconnect layers 120 provide electrical connections to the electrical contact areas of the respective dies 112, 114.

The pattern of the metal RDL, interconnect layer 120 is designed so that there are no metal interconnect layers extending across the sensing region 116 of the sensor die 114.

FIG. 4B shows the bottom side 104 of the multi-die module 100. It shows the generally continuous RDL layer 118. It also shows the RDL layer 118 covering the sensing region 116 of sensor die 114.

In alternative embodiments, the RDL 118 is selectively deposited so that the sensing region 116 is not covered by the RDL.

Returning to FIG. 2, in step 314, called the dicing and bumping step, the multi-die module 100 is removed from the cavity wafer 212, and metal connectors 130-1, 130-2, ..., 130-n are also formed or attached to the RDL layer (by bumping process). Typically these metal connectors will be located on the connection locations or connection points 123 that have been formed in the RDL that provide electrical connection to the metal RDL interconnect layers 120. In some embodiments, the metal connectors are wire bonds. In the typical embodiment, they are solder bumps or balls.

Figure 5A:
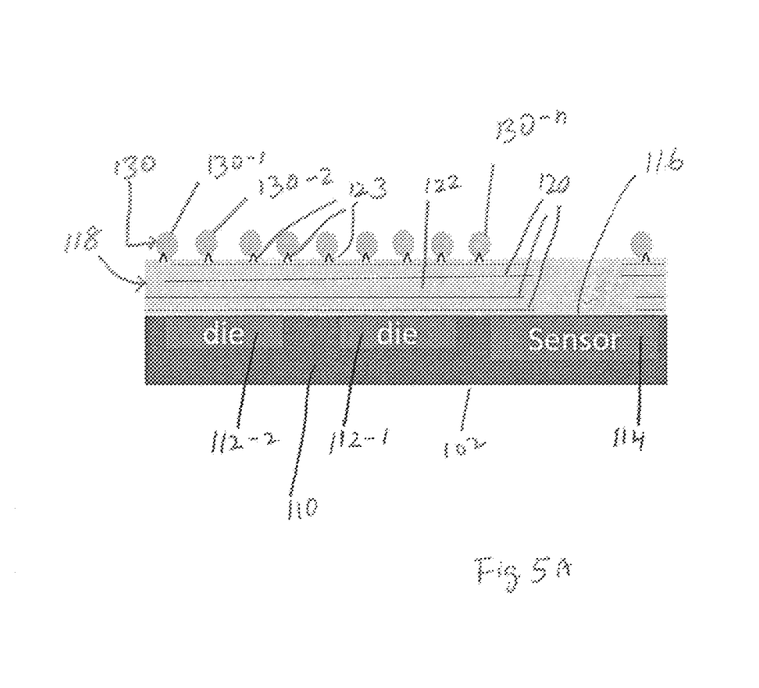
FIG. 5A is a schematic side cross-sectional view of the dies after bumping and dicing, creating a multi-die iUHD module.

FIG. 5A shows solder balls 130-1, 130-2, 130-n connected to the RDL 118 at the connection points 123.

Since the metal interconnect layers 120 of the RDL 118 were designed to avoid any metal layers over the sensing region 116 of the sensor die 114, there are no solder metal connectors or solder balls 130 over this sensing region 116.

Figure 5B:
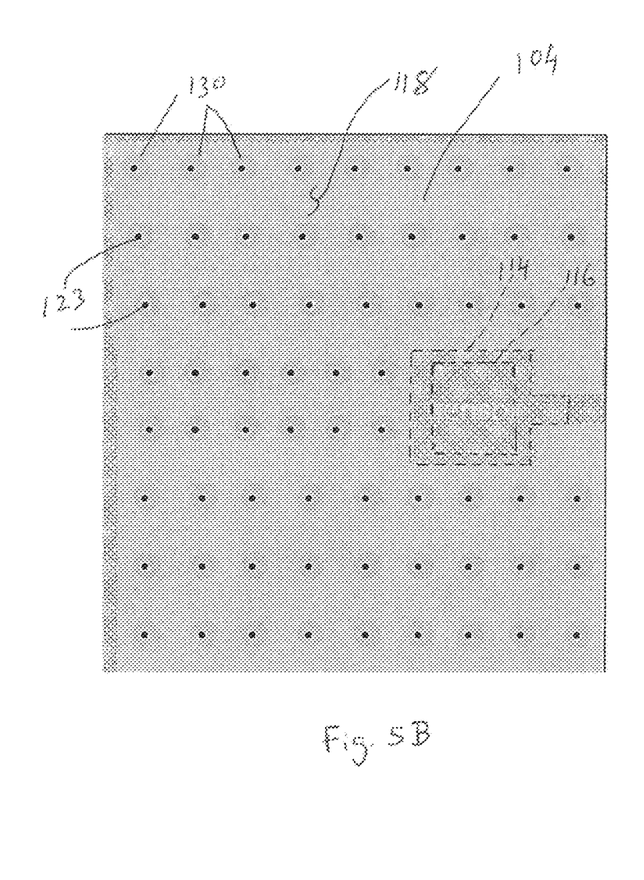
FIG. 5B is a schematic bottom view of the multi-die module after bumping and dicing.

FIG. 5B shows solder balls 130 arrayed across the bottom face 104 of the RDL 118 of the multi-die module 100. Also shown is the sensing region 116 with no solder balls in that area.

Returning to FIG. 2, in the next step 316, the sensing region 116 of the sensor die 114 is exposed. This involves the selective removal of the RDL 118 and specifically the dielectric layers 122 of the RDL 118.

A number of different techniques can be used to expose the sensing region 116 by forming a sensor region port 124 through the RDL 118. Localized dielectric removal is accomplished by one or more of the following techniques: mechanical removal, laser, ion beam milling, reactive ion etching (RIE), plasma etch and chemical etch.

Figure 6A:
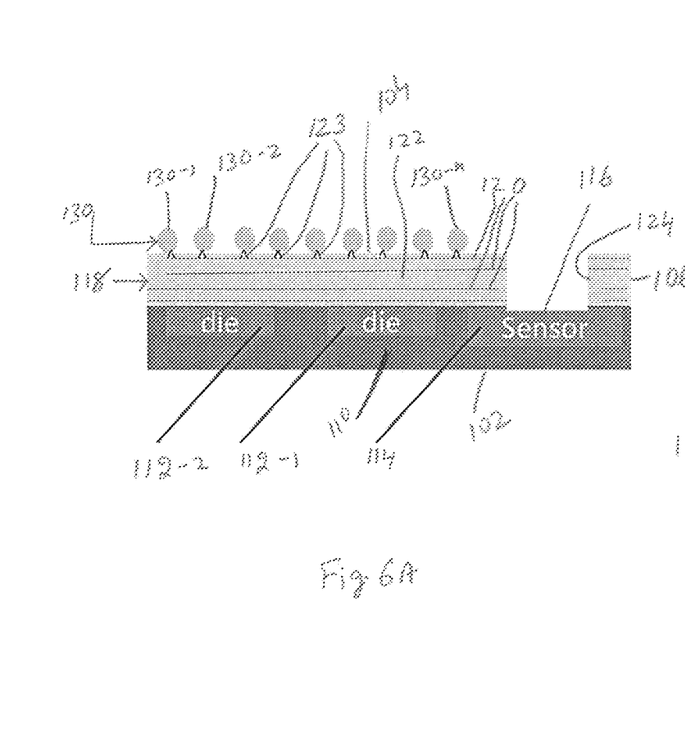
FIG. 6A is a schematic side cross-sectional view of the module after excess dielectric is removed covering the sensing area and nearby area.

FIG. 6A shows the sensor region port 124 extending through the RDL 118 to expose the sensing region 116 of the sensor die 114.

Figure 6B:
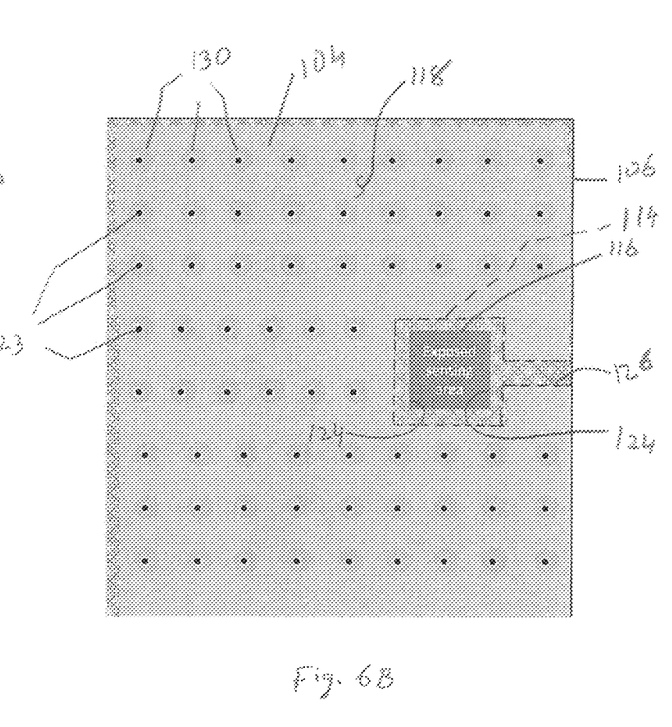
FIG. 6B is a schematic bottom view of the module after excess dielectric is removed from sensing and nearby area.

FIG. 6B shows the bottom side 104 of the multi-die module 100. It shows the sensing region port 124 exposing the sensing region 116 of the sensor die 114. Also shown in this example is a sensor channel 126 that is formed in the RDL 118 that extends between the sensing region port 124 and outer edge 106 of the multi-die module 100.

Returning to FIG. 2, in the next step 318, the channel 126 is formed in the RDL 118. In some embodiments, a protective heat-resistant cap is installed over the sensing region 116 to protect the sensitive sensing region 116 from damage.

Figure 7A:
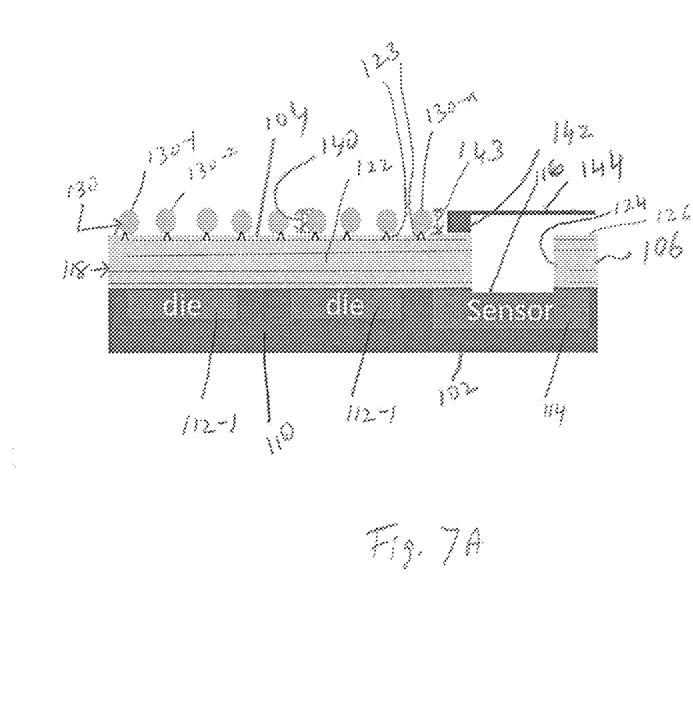
FIG. 7A is a schematic side cross-sectional view of the module with a cantilevered cap attachment to create a channel over the sensor die on right.

FIG. 7A shows the sensor channel 126 and a cantilevered cap 144 extending over the bottom face 104 of the multi-die module 100 and specifically over the sensing region 116 of the sensor die 114. The illustrated cantilevered cap 144 includes a standoff or pillar 142 and the cantilevered section 144; the standoff 142 raises the cantilever above the back surface 104 of the multi-die module. On the other hand, the overall height 143 of the cantilevered cap 144 is lower than the overall height 140 of the metal connectors 130. These respective heights are important so that when the multi-die module is flipped and bonded to the PCB or interposer 132, the tops of the connectors 130 can make solid electrical connections to the connection points on the interposer 132 without mechanical interference from the cantilevered cap 144.

In the illustrated embodiment also the cantilevered cap 144 extends all the way to outer side 106 of the multi-die module 100 to ensure that there is a free channel between the port 124 and the ambient environment.

The heat-resistant cantilevered cap 144 and pillar 142 can be made of metal or other high temperature material (able to withstand soldering temps) and can be attached adhesively or soldered or through eutectic bonding.

Figure 7B:
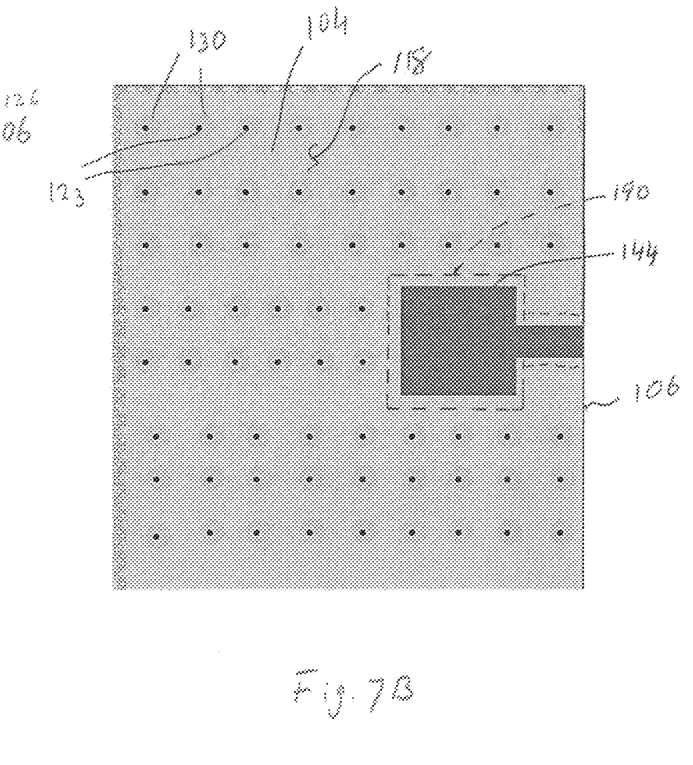
FIG. 7B is a schematic bottom view of the module with the cantilevered cap attachment.

FIG. 7B shows one configuration for the cantilevered cap 144. In this example, the cantilevered cap covers the entirety of the sensing region 116. The standoff 142 extends around the entire perimeter as seen by the dotted line 190. There is no standoff 142 in the region of sensor channel 126. This provides a pathway between the sensing region 116 and the ambient environment through the sensing region port 124 to the edge 106 of the multi-die module.

Figure 8A:
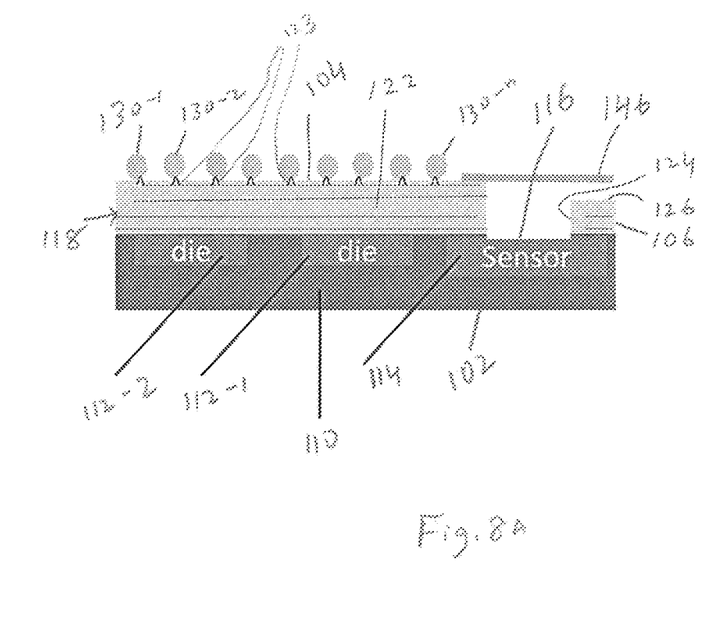
FIG. 8A is a schematic side cross-sectional view of the module with a heat resistant flush cap over the pressure sensing area as an alternate embodiment to the cantilevered cap.
Figure 8B:
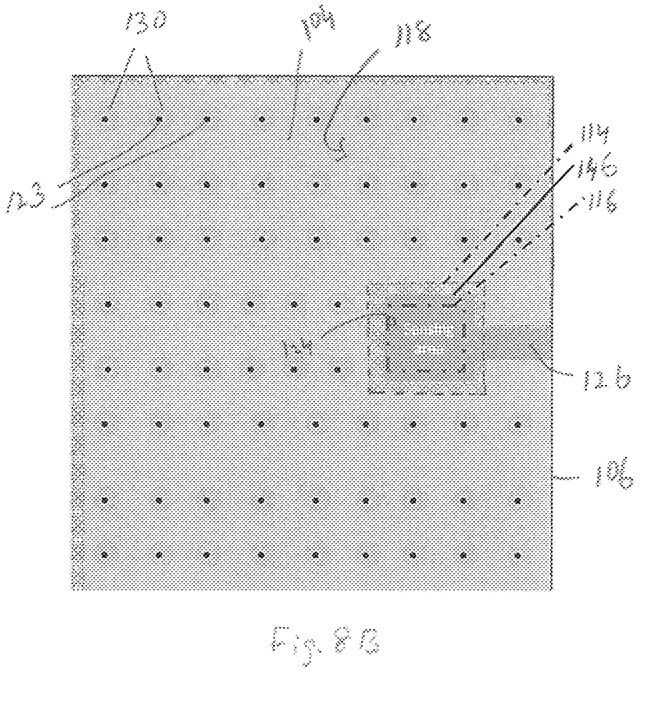
FIG. 8B is a schematic bottom view of the module with the flush cap attachment.

FIGS. 8A and 8B show another configuration for the sensor channel 126. In this example, the sensing region is protected using a heat-resistant flush cap 146 that is generally flush and at generally the same height as the bottom surface of the RDL 118. In the illustrated example, there is no standoff 142 around the periphery of the cap. Instead, to provide a channel to the external environment, the sensor channel 126 is fabricated by removal of at least part of the thickness of the RDL 118 to thereby provide a port to the side 106 of the multi-die module 100.

FIG. 8B shows the sensing region 116 of the sensor die along with the sensing region port 124 formed in the RDL 118. Also shown is the RDL sensor channel 126 that is formed into the RDL 118 to provide a port between the sensing region 116 and the side 106 of the multi-die module 100.

The flush cap 146 can be made heat resistant by using metal or kapton material for its construction.

Returning to FIG. 2, the next step 320 involves mounting the multi-chip unit on a PCB or interposer and making the unit less fragile and more reliable while still ensuring access to the pressure sensing channel.

Figure 9:
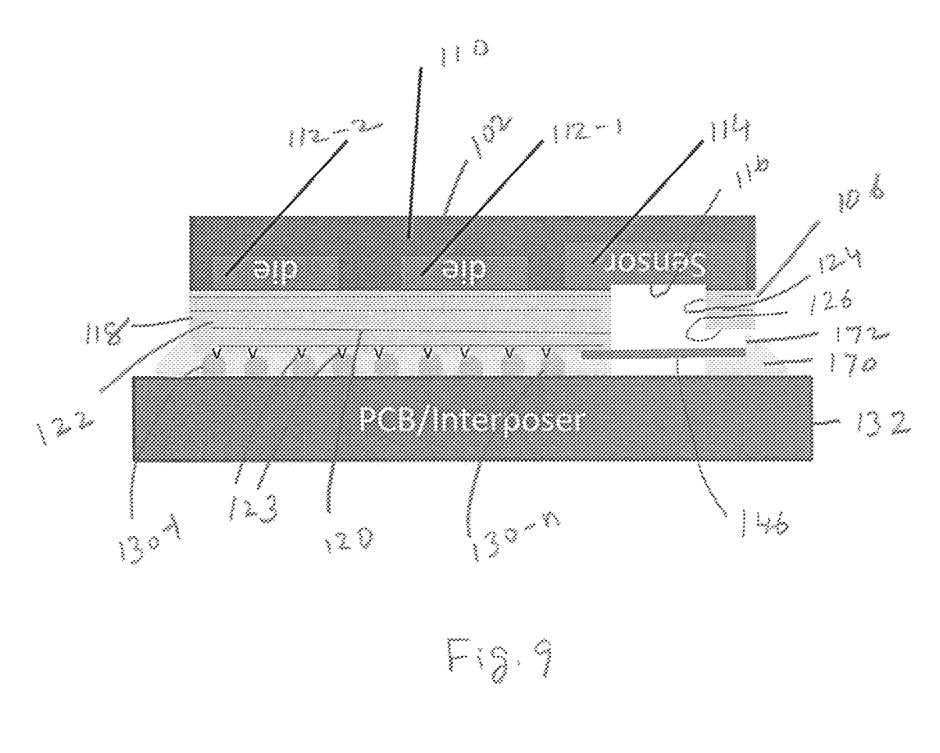
FIG. 9 is a schematic side cross-sectional view showing under-fill adhesive application to multi-die unit connected to the printed circuit board (PCB) or interposer.

As shown in FIG. 9, in some examples, under-fill is added around the multi-die module 100 and the PCB/interposer 132 to seal around the multi-die module 100. Another reason for using under-fill is to make the multi-die module less fragile and more reliable and robust. In typical examples, the under-fill is an adhesive such as an epoxy or an epoxy with a silica fill. Such an epoxy mechanically protects the solder joints and the solder ball connectors. In this example, there is a risk that under-fill 170 will seal off or otherwise obstruct the sensor channel 126, In the illustrated example, the under-fill 170 includes a lip region 172 that obstructs the clear access through the sensor port 124 around the edge of the module.

Figure 10:
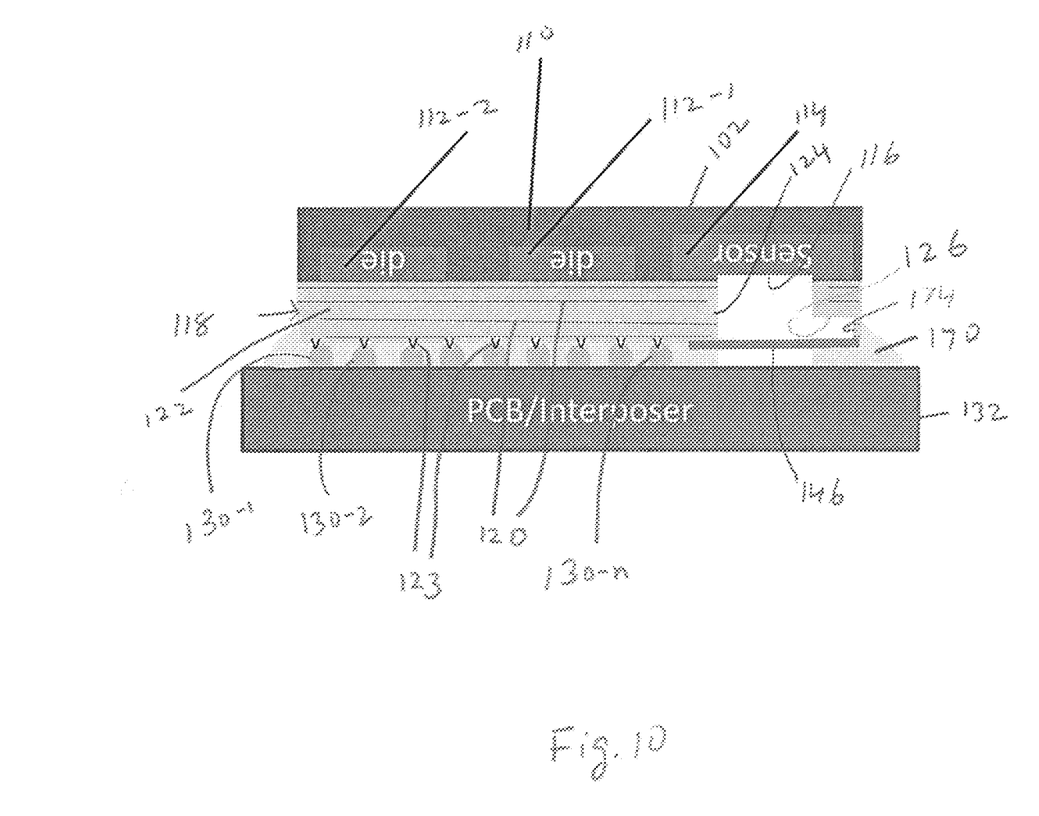
FIG. 10 is a schematic side cross-sectional view showing a small wall of RDL layer near the pressure sensor channel near to the edge.

FIG. 10 shows another scenario, a small wall 174 of the RDL layer 118 is left in the early fabrication steps, this small wall protects the channel 126 from the under-fill 170 seeping into the sensor channel 126.

Figure 11:
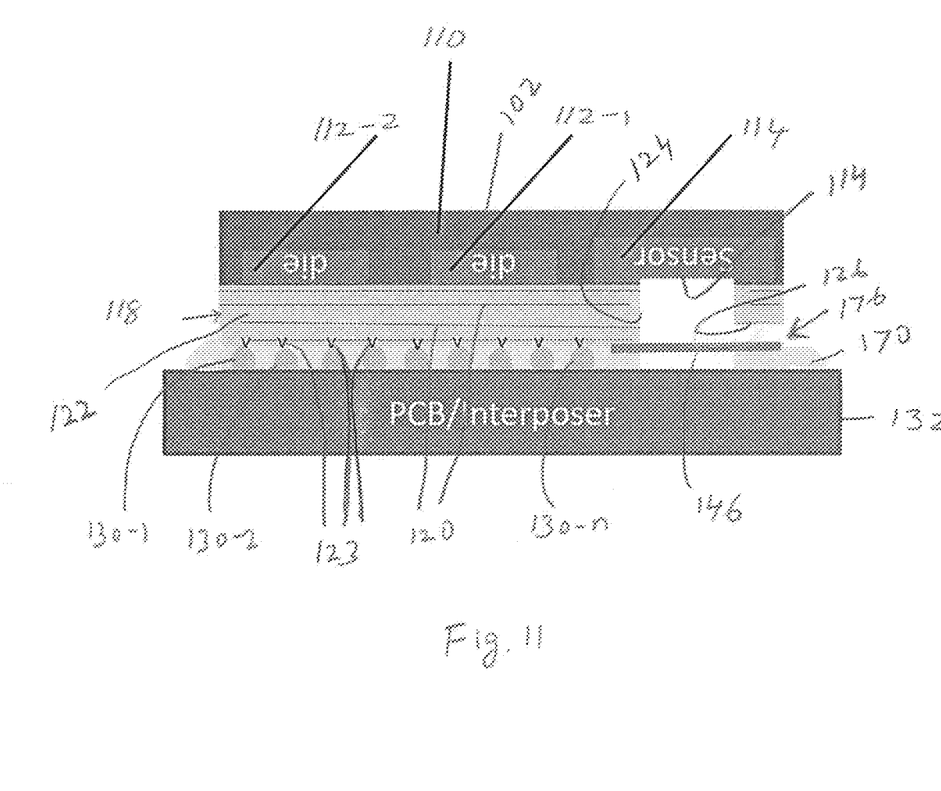
FIG. 11 is a schematic side cross-sectional view showing the opening of the channel to pressure sensor sensing region by removing under-fill, dielectric and the wall (if it exists).

As shown in FIG. 11, in either of these cases where there is under-fill obstructing the channel (FIG. 9) or the small RDL wall 174 is left during the processing in order to prevent the under-fill from seeping into the sensor channel (FIG. 10), in a final step, the channel is opened by removal of the RDL or the access under-fill. In general, this removal can be performed using mechanical removal, laser, ion beam milling, reactive ion etching, plasma etching or a chemical edge. In the preferred embodiment, reactive ion etching is used. In any event, the reactive ion etching comes in at an angle 176 to remove any excess RDL wall 174 or the under-fill 170 in the region of the desired sensor channel 126.

Figure 12A:
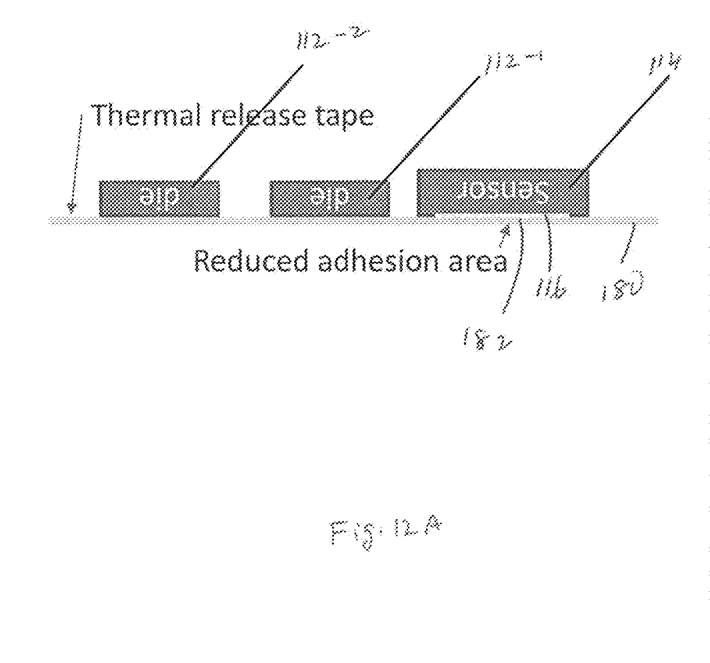
FIG. 12A is a schematic of the side view of the unit using thermal release tape and Parylene as a reduced adhesive agent over the sensing area before the RDL process to protect the fragility of the dies during encapsulation, for example.
Figure 12B:
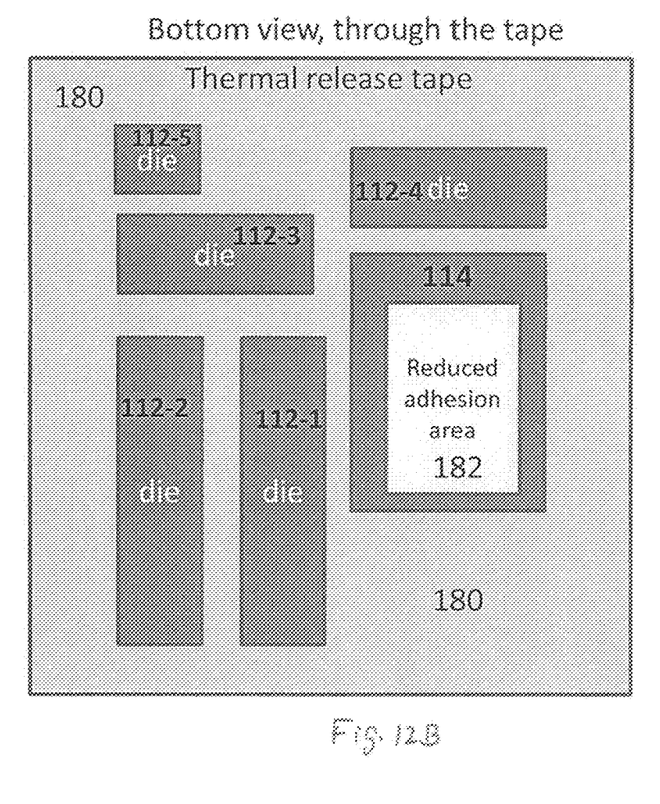
FIG. 12B is a schematic bottom view of the configuration shown in FIG. 12A with the thermal release tape and reduced adhesive area.

FIGS. 12A and 12B illustrate a potentially additional manufacturing step that is used to protect the sensor die 114 and the other dies during the encapsulation steps of manufacturing prior to the deposition of the RDL 118. In this example, as shown in FIG. 12A, the sensor die 114 and the other dies 112 are adhered to the thermal release tape 180. However in the region of the sensing region 116, the thermal release tape 180 has an area 182 of lowered or no adhesion. This reduced adhesion area 182 is more clearly shown in FIG. 12B that shows the sensor die 114 along with the other dies 112 arrayed on the thermal release tape 180.

In one example, a film such as Parylene placed over the sensing region 116 of the sensor die 114 before the dies 112, 114 are attached to the thermal release tape 180. In another embodiment, a non-tacky Fillmore material is a selectively applied to the thermal release tape prior to the placement of the sensor die 114 on the thermal release tape 180. Generally, the film must be thin enough not to interfere with encapsulation and can be removed by non-mechanical means such as laser or reactive ion etching.

While this invention has been particularly shown and described with references to preferred embodiments thereof, it will be understood by those skilled in the art that various changes in form and details may be made therein without departing from the scope of the invention encompassed by the appended claims.

What is claimed is:

1. An integrated circuit die module, comprising:
   multiple dies, including at least one die with a sensor having a sensing region;
   an encapsulation layer covering top sides of the multiple dies;
   a redistribution layer covering bottom sides of the multiple dies except for the sensing region, further comprising a cap over the sensing region, which has at least a portion that is spaced away from the bottom side of the module and metal connectors on the redistribution layer to provide connection points to the module, wherein a height of the cap from the bottom side of the module is less than a height of the metal connectors.

2. A module as claimed in claim 1, wherein the redistribution layer is removed from over the sensing region.

3. A module as claimed in claim 1, wherein the redistribution layer is not deposited over the sensing region.

4. A module as claimed in claim 1, wherein the sensor is a pressure sensor.

5. A module as claimed in claim 1, wherein the sensor is a gas sensor.

6. A module as claimed in claim 1, wherein the redistribution layer comprises dielectric layers and metal layers.

7. A module as claimed in claim 1, wherein the module is mounted on an interposer.

8. A module as claimed in claim 1, wherein the sensing region is exposed to an ambient atmosphere.

9. A module as claimed in claim 1, wherein the redistribution layer extends from the sensing region over bottom sides of multiple dies.

10. A multi-die module manufacturing method, comprising:
    encapsulating multiple dies, including at least one die with a sensor to form a multi-die module;
    covering bottom sides of the dies with a redistribution layer covering except for a sensing region of the sensor, wherein the redistribution layer covering includes stacked metal layers that extend over the bottom sides of the multiple dies except for the sensing region;
    placing metal connectors on the redistribution layer to provide connection points to the module; and
    placing a cap over the sensing region, which has at least a portion that is spaced away from the bottom side of the module, wherein a height of the cap from the bottom side of the module is less than a height of the metal connectors.

11. A method as claimed in claim 10, further comprising removing the redistribution layer from over the sensing region.

12. A method as claimed in claim 10, further comprising not depositing the redistribution layer over the sensing region.

13. A method as claimed in claim 10, wherein the sensor is a pressure sensor.

14. A method as claimed in claim 10, wherein the sensor is a gas sensor.

15. A method as claimed in claim 10, wherein the metal connectors are placed on the redistribution layer to provide connection points between the module and an interposer.

* * * * *